(12) United States Patent
Fukunaga

(10) Patent No.: US 6,661,821 B2
(45) Date of Patent: Dec. 9, 2003

(54) SEMICONDUCTOR LASER ELEMENT HAVING GREAT BANDGAP DIFFERENCE BETWEEN ACTIVE LAYER AND OPTICAL WAVEGUIDE LAYERS, AND INCLUDING ARROW STRUCTURE FORMED WITHOUT P-AS INTERDIFFUSION

(75) Inventor: Toshiaki Fukunaga, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/254,549

(22) Filed: Sep. 26, 2002

(65) Prior Publication Data
US 2003/0063644 A1 Apr. 3, 2003

(30) Foreign Application Priority Data
Sep. 28, 2001 (JP) .................................. 2001-302225

(51) Int. Cl.[7] ................................................. H01S 5/00
(52) U.S. Cl. ............................. 372/43; 372/46; 372/45
(58) Field of Search ............................... 372/43, 45, 49

(56) References Cited
U.S. PATENT DOCUMENTS 5,528,614 A * 6/1996 Watanabe .................... 372/45
5,606,570 A    2/1997 Botez et al.
5,889,805 A * 3/1999 Botez et al. .................. 372/45
6,396,863 B1 * 5/2002 Fukunaga ..................... 372/46
6,560,261 B2 * 5/2003 Fukunaga et al. ............ 372/46
6,567,444 B2 * 5/2003 Hayakawa .................... 372/45
6,580,738 B2 * 6/2003 Fukunaga ..................... 372/46

* cited by examiner

Primary Examiner—Paul Ip
Assistant Examiner—Dung Nguyen
(74) Attorney, Agent, or Firm—Sughrue Mion, PLLC

(57) ABSTRACT

In a semiconductor laser element: an n-type $Al_xGa_{1-x}As$ cladding layer, an undoped or n-type $In_{0.49}Ga_{0.51}P$ optical waveguide layer, an $In_{x1}Ga_{1-x1}As_{1-y1}P_{y1}$ compressive-strain quantum-well active layer, an undoped or p-type $In_{0.49}Ga_{0.51}P$ optical waveguide layer, and a p-type GaAs etching stop layer are formed on an n-type GaAs substrate; a p-type $In_{x8}Ga_{1-x8}P$ etching stop layer and an n-type GaAs current confinement layer are formed corresponding to high-refractive-index regions which realize an ARROW structure; a p-type $In_{x9}Ga_{1-x9}P$ etching stop layer is formed over the n-type GaAs current confinement layer and exposed areas of the first etching stop layer; a p-type GaAs etching stop layer and an n-type $In_{0.5}(Ga_{1-z}Al_z)_{0.5}P$ current confinement layer are formed in regions other than a current injection region; and a p-type cladding layer made of AlGaAs or $In_{0.5}(Ga_{1-z}Al_z)_{0.5}P$ and a p-type GaAs contact layer are formed over the entire upper surface.

5 Claims, 6 Drawing Sheets

SEMICONDUCTOR LASER ELEMENT HAVING GREAT BANDGAP DIFFERENCE BETWEEN ACTIVE LAYER AND OPTICAL WAVEGUIDE LAYERS, AND INCLUDING ARROW STRUCTURE FORMED WITHOUT P-AS INTERDIFFUSION

BACKGROUND OF THE INVENTION

1. Field of the Invention

The present invention relates to a semiconductor laser element including an ARROW (Antiresonant Reflecting Optical Waveguide) structure. In particular, the present invention relates to a semiconductor laser element including an ARROW structure and emitting laser light in the 980 nm band.

2. Description of the Related Art

A reliable high-power semiconductor laser element which emits a high-quality, diffraction-limited beam is required for use as a light source in exciting an optical fiber amplifier.

U.S. Pat. No. 5,606,570 discloses a semiconductor laser element having an ARROW structure as a semiconductor laser element which can emit a high-output-power, diffraction-limited laser beam in the 980 nm band. The disclosed semiconductor laser element includes an InGaAs active layer and an InGaAlP current confinement layer, and uses GaAs as a medium having a high refractive index. The ARROW structure is a structure for confining light in core regions. The disclosed ARROW structure includes a plurality of core regions having a low equivalent (effective) refractive index, first high-refractive-index regions which have a high equivalent refractive index and are arranged between the plurality of core regions and on the outer sides of the plurality of core regions, low-refractive-index regions which have an equivalent refractive index approximately identical to that of the plurality of core regions and are arranged on the outer sides of the outermost ones of the high-refractive-index regions, and second high-refractive-index regions which have a high equivalent refractive index and are arranged on the outer sides of the low-refractive-index regions. The first high-refractive-index regions behave as reflectors of light in the fundamental mode, and the low-refractive-index regions suppress leakage of light. Thus, the semiconductor laser element can be controlled so as to operate in the fundamental transverse mode.

In addition, it is reported that a preferable value of the width $d_{b1}'$ of each of the outermost ones of the first high-refractive-index regions is determined in accordance with the equation (1), a preferable value of the width $d_{b2}'$ of each of the first high-refractive-index regions arranged between the plurality of core regions is determined in accordance with the equation (2), and a preferable value of the width of each of the low-refractive-index regions is $d_c'/2$, where $d_c'$ is the width of each of the plurality of core regions. In the equations (1) and (2), $\lambda$ is the oscillation wavelength, $n_c'$ is the equivalent refractive index of the plurality of core regions, and $n_b'$ is the equivalent refractive index of the first high-refractive-index regions.

$$d_{b1}' = \frac{3\lambda}{4\left\{n_b'^2 - n_c'^2 + \left(\frac{\lambda}{2d_c'}\right)^2\right\}^{\frac{1}{2}}} \quad (1)$$

$$d_{b2}' = \frac{\lambda}{2\left\{n_b'^2 - n_c'^2 + \left(\frac{\lambda}{2d_c'}\right)^2\right\}^{\frac{1}{2}}} \quad (2)$$

In order to produce an ARROW structure, it is necessary to use a regrowth technique. However, in the semiconductor laser element disclosed in U.S. Pat. No. 5,606,570, GaAs and InGaP layers (or InAlP, GaAs, and InGaP layers) are exposed at the surface as a base of the regrowth. Therefore, P-As interdiffusion occurs at the exposed surface during a process of raising temperature for the regrowth, and thus the regrowth is likely to become defective. As a result, the above semiconductor laser element is not actually used. Further, since the difference in the bandgap between the optical waveguide layer and the active layer is small, the above semiconductor laser element has poor temperature characteristics.

SUMMARY OF THE INVENTION

An object of the present invention is to provide a semiconductor laser element which includes an ARROW structure and is reliable in a wide output power range from low to high output power levels.

(I) According to the present invention, there is provided a semiconductor laser element comprising: a GaAs substrate of a first conductive type; a lower cladding layer formed above the GaAs substrate and made of $Al_xGa_{1-x}As$ of the first conductive type, where $0.57 \leq x \leq 0.8$; a lower optical waveguide layer formed above the lower cladding layer and made of $In_{0.49}Ga_{0.51}P$ which is undoped or the first conductive type; a compressive-strain quantum-well active layer formed above the lower optical waveguide layer and made of undoped $In_{x1}Ga_{1-x1}As_{1-y1}P_{y1}$, where $0.49y1 < x1 \leq 0.4$ and $0 \leq y1 \leq 0.1$; an upper optical waveguide layer formed above the compressive-strain quantum-well active layer and made of $In_{0.49}Ga_{0.51}P$ which is undoped or a second conductive type; a first etching stop layer formed above the upper optical waveguide layer and made of GaAs of the second conductive type; a second etching stop layer made of $In_{x8}Ga_{1-x8}P$ of the second conductive type and formed above the first etching stop layer other than stripe areas of the first etching stop layer corresponding to at least one current injection region and low-refractive-index regions located on outer sides of the at least one current injection region and separated from the at least one current injection region or outermost ones of the at least one current injection region by a predetermined interval, where $0 \leq x8 \leq 1$, and the stripe areas of the first etching stop layer extend in a direction of a laser resonator; a first current confinement layer made of GaAs of the first conductive type and formed above the second etching stop layer; a third etching stop layer made of $In_{x9}Ga_{1-x9}P$ of the second conductive type and formed over the first current confinement layer and the stripe areas of the first etching stop layer, where $0 \leq x9 \leq 1$; a fourth etching stop layer made of GaAs of the second conductive type and formed above the third etching stop layer other than at least one stripe area of the third etching stop layer corresponding to the at least one current injection region; a second current confinement layer made of $In_{0.5}(Ga_{1-z}Al_z)_{0.5}P$ of the first conductive type and formed above the fourth etching stop layer, where $0.1 \leq z \leq 1$; a first upper cladding layer of the second conductive type, formed above the second current confinement layer and the at least one stripe area of the third etching stop layer, and made of one of AlGaAs and $In_{0.5}(Ga_{1-z}Al_z)_{0.5}P$, where $0.1\leq z\leq 1$; and a contact layer made of GaAs of the second conductive type and formed above the first upper cladding layer.

The first conductive type is different in the polarity of carriers from the second conductive type. That is, when the first conductive type is n type, and the second conductive type is p type.

In addition, the term "undoped" means that a material is not doped with any conductive impurity.

Preferably, the semiconductor laser element according to the present invention may also have one or any possible combination of the following additional features (i) to (iv).

(i) Each of the at least one current injection region may have a width equal to or greater than 3 micrometers.

(ii) The semiconductor laser element according to the present invention may further comprise a second upper cladding layer formed between the upper optical waveguide layer and the first etching stop layer, and made of a material having identical composition and an identical conductive type to the first upper cladding layer.

(iii) The first current confinement layer may include first and second sublayers made of GaAs of the first conductive type, and a quantum-well layer formed between the first and second sublayers and made of an InGaAs material which has a smaller bandgap than the bandgap of the compressive-strain quantum-well active layer.

(iv) The semiconductor laser element according to the present invention may further comprise a lower barrier layer formed between the lower optical waveguide layer and the compressive-strain quantum-well active layer, and an upper barrier layer formed between the upper optical waveguide layer and the compressive-strain quantum-well active layer, where each of the lower barrier layer and the upper barrier layer is made of undoped $In_{x2}Ga_{1-x2}As_{1-y2}P_{y2}$, where $0\leq x2\leq 0.3$ and $0\leq y2\leq 0.6$.

(II) The advantages of the present invention are as follows.

(i) Since the semiconductor laser element according to the present invention has the aforementioned construction, in the direction perpendicular to the thickness direction and the light propagation direction in the active layer, first high-refractive-index regions which have a relatively high equivalent refractive index are realized between at least one core region (corresponding to the at least one current injection region each of which has a stripe shape) and on the outer sides of the at least one core region, low-refractive-index regions which have a relatively low equivalent refractive index are realized on the outer sides of the outermost ones of the first high-refractive-index regions, and second high-refractive-index regions which have a relatively high equivalent refractive index are realized on the outer sides of the low-refractive-index regions. That is, the aforementioned ARROW structure is realized.

Since the semiconductor laser element according to the present invention includes the ARROW structure, the semiconductor laser element according to the present invention can emit a single peak beam in a transverse mode which is more effectively controlled than that in semiconductor laser elements which do not include the ARROW structure, even when the stripe width is increased.

In order to effectively control the transverse mode oscillation in the semiconductor laser elements which do not include the ARROW structure, the stripe width is required to be reduced to 3 micrometers or smaller, i.e., the width of the active region is required to be reduced. Therefore, when the output power is increased, the optical density in the active layer increases, and thus facet degradation is likely to occur. Consequently, the semiconductor laser elements which do not include the ARROW structure cannot operate with high output power in an effectively controlled transverse mode.

On the other hand, since the semiconductor laser element according to the present invention includes the ARROW structure, light can be satisfactorily confined in a wide stripe (active) region in the semiconductor laser element according to the present invention, and therefore the semiconductor laser element according to the present invention can emit laser light in the fundamental transverse mode from the wide active region.

(ii) Since the double-layer etching stop layers constituted by the InGaP layer and the GaAs layer are used, the precision in etching can be improved, i.e., it is possible to precisely form the distribution of the equivalent refractive index which realizes the ARROW structure.

(iii) In particular, when the width of the active region is increased to 3 micrometers or greater, the optical density in the active layer can be reduced, and therefore the temperature rise due to non-radiative recombination in vicinities of end facets can be suppressed. Thus, the semiconductor laser element according to the present invention can emit a laser beam in the fundamental transverse mode with higher power than the semiconductor laser elements which do not include the ARROW structure.

(iv) Since it is possible to form an internal stripe structure as well as the ARROW structure, the contact area between the electrode and the contact layer can be increased, and therefore the contact resistance can be reduced. Thus, it is possible to suppress the drop of optical output power due to heat generation.

(v) Since, in the semiconductor laser element according to the present invention, the optical waveguide layers are made of $In_{0.49}Ga_{0.51}P$, and the compressive-strain quantum-well active layer is made of undoped $In_{x1}Ga_{1-x1}As_{1-y1}P_{y1}$ ($0.49y1<x1\leq 0.4$, $0\leq y1\leq 0.1$), it is possible to increase the difference in the bandgap between the compressive-strain quantum-well active layer and the optical waveguide layers. Therefore, it is possible to prevent the carrier leakage, lower the threshold current, and improve the temperature characteristics.

(vi) In the case where a second upper cladding layer made of a material having identical composition and an identical conductive type to the first upper cladding layer is formed between the upper optical waveguide layer and the first etching stop layer, it is also possible to realize the distribution of the equivalent refractive index in the lateral direction perpendicular to the stripes which is necessary for the formation of the ARROW structure.

(vii) In the case where the first current confinement layer includes first and second sublayers made of GaAs of the first conductive type, and a quantum-well layer formed between the first and second sublayers and made of an InGaAs material which has a smaller bandgap than the bandgap of the compressive-strain quantum-well active layer, it is possible to increase the gain of oscillation in the fundamental transverse mode since the InGaAs quantum-well layer absorbs light.

(viii) In the case where barrier layers made of undoped $In_{x2}Ga_{1-x2}As_{1-y2}P_{y2}$ ($0\leq x2<0.3$, $0\leq y2\leq 0.6$) are formed between the compressive-strain quantum-well active layer and the upper and lower optical waveguide layers, it is possible to achieve further higher performance.

DESCRIPTION OF PREFERRED EMBODIMENTS

Embodiments of the present invention are explained in detail below with reference to drawings.

First Embodiment

The semiconductor laser element as the first embodiment of the present invention is explained below. FIGS. 1A to 1D are diagrams illustrating representative stages in a process for producing the semiconductor laser element as the first embodiment.

In organometallic vapor phase epitaxy used in the process explained below, trimethyl gallium (TMG), trimethyl indium (TMI), trimethyl aluminum (TMA), arsine, and phosphine are used as raw materials, silane gas is used as n-type dopant gas, and dimethyl zinc (DMZ) is used as p-type dopant gas.

Figure 1A:
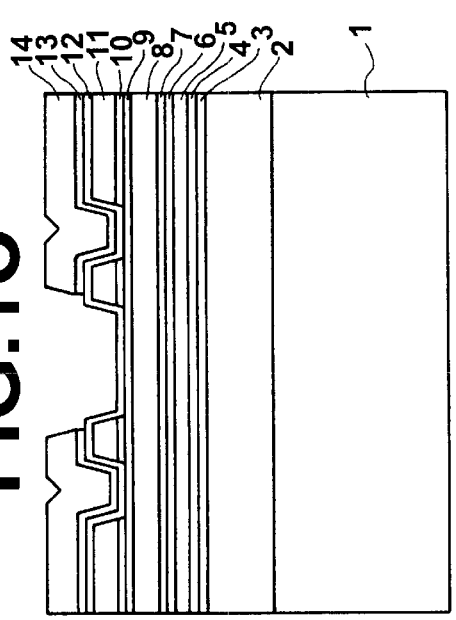
FIGS. 1A to 1D are diagrams illustrating representative stages in a process for producing a semiconductor laser element as a first embodiment.

As illustrated in FIG. 1A, an n-type $Al_xGa_{1-x}As$ lower cladding layer 2 ($0.57 \leq x \leq 0.8$), an n-type or i-type (intrinsic) $In_{0.49}Ga_{0.51}P$ lower optical waveguide layer 3, an i-type $In_{x2}Ga_{1-x2}As_{1-y2}P_{y2}$ lower barrier layer 4 ($0 \leq x2 \leq 0.3$, $0 \leq y2 \leq 0.6$), an i-type $In_{x1}Ga_{1-x1}As_{1-y1}P_{y1}$ compressive-strain quantum-well active layer 5 ($0.49y1 < x1 \leq 0.4$, $0 \leq y1 \leq 0.1$), an i-type $In_{x2}Ga_{1-x2}As_{1-y2}P_{y2}$ upper barrier layer 6, a p-type or i-type $In_{0.49}Ga_{0.51}P$ upper optical waveguide layer 7, a p-type $Al_xGa_{1-x}As$ first upper cladding layer 8, a p-type GaAs first etching stop layer 9, a p-type $In_{x8}Ga_{1-x8}P$ second etching stop layer 10 ($1 \leq x8 \leq 1$), and an n-type GaAs first current confinement layer 11 having a thickness of 0.5 micrometers are formed on a (001) face of an n-type GaAs substrate 1 by organometallic vapor phase epitaxy.

Figure 1B:
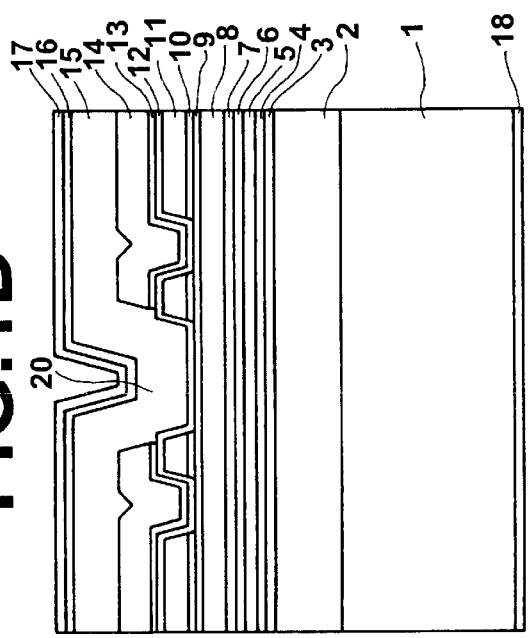

Next, a resist pattern which includes a center stripe opening and two side stripe openings is formed on the n-type GaAs first current confinement layer 11 by photolithography. The center stripe opening corresponds to a current injection region, and has a width of 5 micrometers. The side stripe openings each have a width of 2.5 micrometers, and are located on both sides of the center stripe opening and separated from the center stripe opening by 1.9 micrometers. The n-type GaAs first current confinement layer 11 is etched with a solution of sulfuric acid and hydrogen peroxide as an etchant by using the resist pattern as a mask. At this time, the etching automatically stops at the upper boundary of the p-type $In_{x8}Ga_{1-x8}P$ second etching stop layer 10, and stripe areas of the p-type $In_{x8}Ga_{1-x8}P$ second etching stop layer 10 corresponding to the above center and side stripe openings are exposed. Then, the above resist is removed, and the exposed stripe areas of the p-type $In_{x8}Ga_{1-x8}P$ second etching stop layer 10 are etched with a hydrochloric acid etchant. At this time, the etching automatically stops at the upper boundary of the p-type GaAs first etching stop layer 9. Therefore, stripe areas of the p-type GaAs first etching stop layer 9 corresponding to the above center and side stripe openings are exposed, and only the GaAs layers are exposed at the entire upper surface of the layered structure formed as above. Subsequently, the temperature is raised in an arsenic atmosphere, and thereafter a p-type $In_{x9}Ga_{1-x9}P$ third etching stop layer 12 ($0 \leq x9 \leq 1$), a p-type GaAs fourth etching stop layer 13, and an n-type $In_{0.5}(Ga_{1-z}Al_z)_{0.5}P$ second current confinement layer 14 ($0 \leq z \leq 1$) are formed on the entire surface of the above layered structure, as illustrated in FIG. 1B, by changing gas in turn.

Figure 1C:
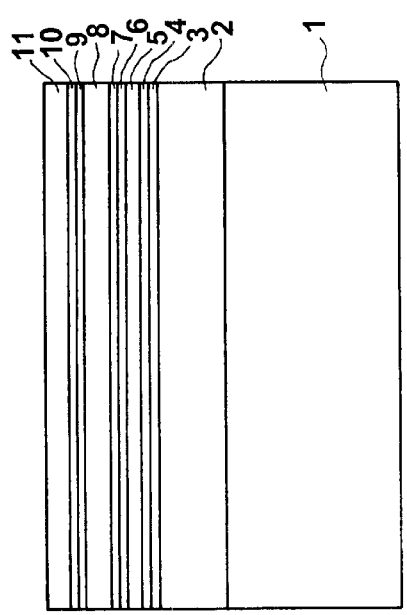

Subsequently, a resist is applied to the surface of the n-type $In_{0.5}(Ga_{1-z}Al_z)_{0.5}P$ second current confinement layer 14, and an area of the resist corresponding to the current injection region is removed so as to expose a stripe area of the n-type $In_{0.5}(Ga_{1-z}Al_z)_{0.5}P$ second current confinement layer 14 corresponding to the current injection region, as illustrated in FIG. 1C. Then, the exposed stripe area of the n-type $In_{0.5}(Ga_{1-z}Al_z)_{0.5}P$ second current confinement layer 14 is etched with a hydrochloric acid etchant by using the remaining resist as a mask. At this time, the etching automatically stops at the upper boundary of the p-type GaAs fourth etching stop layer 13, and a stripe area of the p-type GaAs fourth etching stop layer 13 corresponding to the current injection region is exposed. Thereafter, the remaining resist is removed, and the exposed stripe area of the p-type GaAs fourth etching stop layer 13 is etched with a sulfuric acid etchant. At this time, the etching automatically stops at the upper boundary of the p-type $In_{x9}Ga_{1-x9}P$ third etching stop layer 12, and a stripe area of the p-type $In_{x9}Ga_{1-x9}P$ third etching stop layer 12 corresponding to the current injection region is exposed. Thus, a groove for the current injection region is formed as illustrated in FIG. 1C. That is, only the InGaP layer and the $In_{0.5}(Ga_{1-z}Al_z)_{0.5}P$ layer are exposed at the surface as a base of regrowth.

Figure 1D:
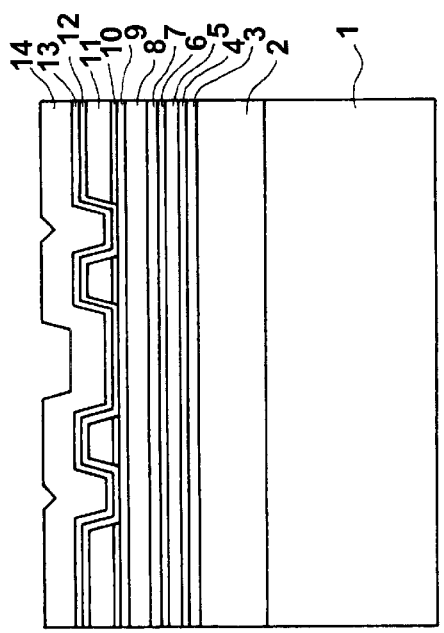

Finally, the temperature is raised in a phosphorus atmosphere, and thereafter a p-type $In_{0.5}(Ga_{1-z}Al_z)_{0.5}P$ second upper cladding layer 15 ($0 \leq z \leq 1$) and a p-type GaAs contact layer 16 are formed as illustrated in FIG. 1D. Then, a p electrode 17 is formed on the p-type GaAs contact layer 16. In addition, the exposed (opposite) surface of the substrate 1 is polished, and an n electrode 18 is formed on the polished surface of the substrate 1. Next, both end surfaces of the layered construction are cleaved so as to form resonator surfaces, and a high reflectance coating and a low reflectance coating are provided on the respective resonator surfaces. Thereafter, the construction thus formed is further formed into a chip of a semiconductor laser element.

Figure 2:
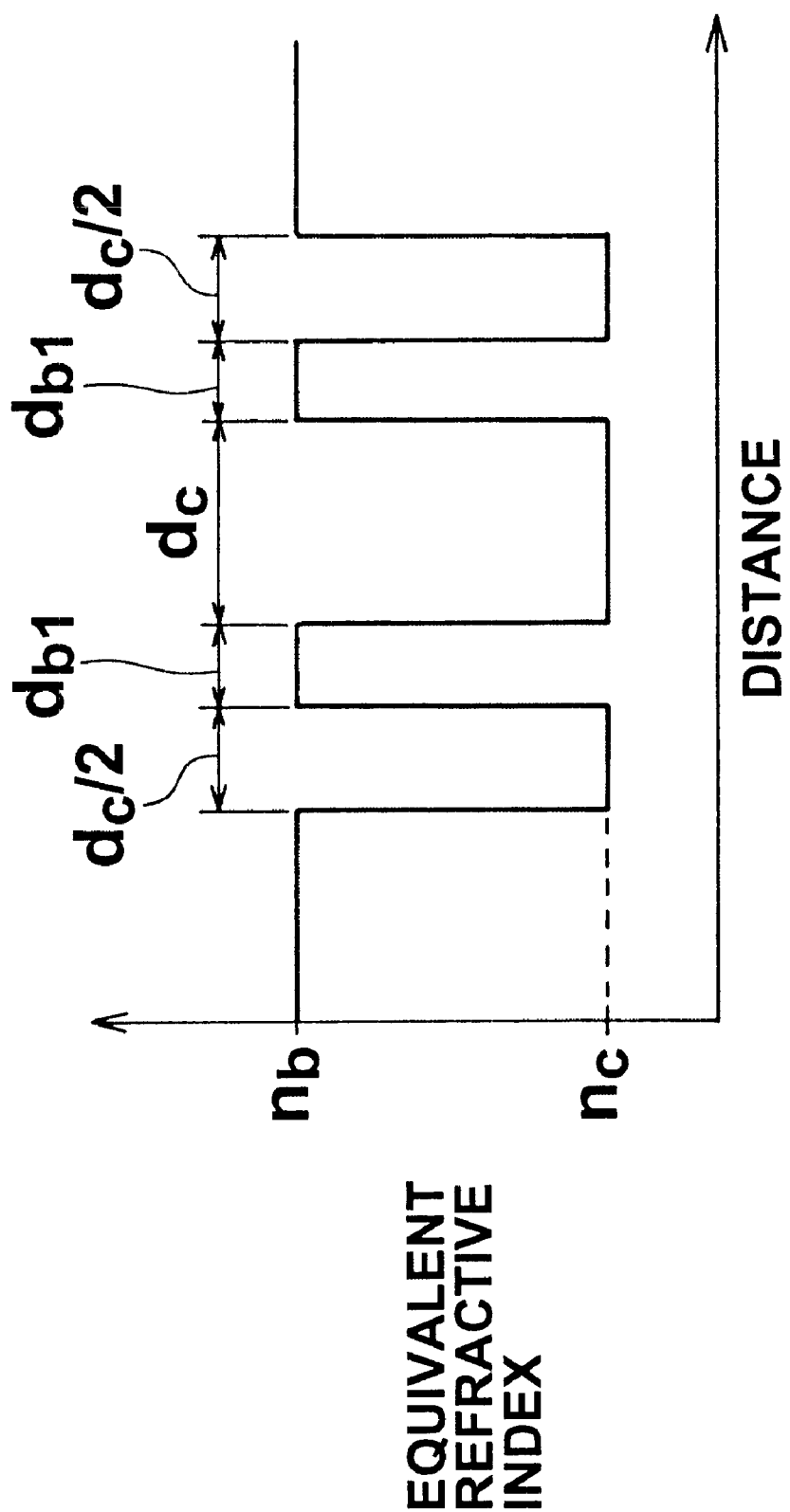
FIG. 2 is a diagram illustrating a distribution of the equivalent refractive index of an active layer in a direction perpendicular to the thickness direction and the light propagation direction in the case where the semiconductor laser element includes a single-core ARROW structure.

FIG. 2 shows a distribution of the equivalent refractive index of the active layer of the semiconductor laser element of FIG. 1D in the direction perpendicular to the thickness direction and the light propagation direction. As illustrated in FIG. 2, the core region being located at the center and corresponding to the current injection opening 20 has a width $d_c$ and a low equivalent refractive index $n_c$, a first pair of stripe regions being immediately adjacent to the core region on both sides and each having a width $d_{b1}$ have a high equivalent refractive index $n_b$, a second pair of stripe regions being located on the outer sides of the first pair of stripe regions and each having a width $d_c/2$ have the low equivalent refractive index $n_c$, and the other regions located on the outer sides of the second pair of stripe regions have the high equivalent refractive index $n_b$. Thus, a satisfactory ARROW structure is realized.

It is preferable that the width $d_{b1}$ is determined by the following equation (3), where $\lambda$ is the oscillation wavelength.

$$d_{b1} = \frac{3\lambda}{4\left\{n_b^2 - n_c^2 + \left(\frac{\lambda}{2d_c}\right)^2\right\}^{\frac{1}{2}}} \quad (3)$$

In particular, the provision of the above second pair of stripe regions enables prevention of leakage of light in the lateral direction perpendicular to the thickness direction and the light propagation direction (where the above distribution of the equivalent refractive index is realized in the lateral direction), emission of a single-peak, diffraction-limited beam, and realization of a satisfactory ARROW structure.

In the construction of the semiconductor laser element according to the present invention, the materials exposed at the surface as the base of the regrowth contain only one of As and P (as group V elements). Therefore, it is possible to prevent interdiffusion of As and P in the process of raising the temperature for the regrowth, and obtain high quality crystals.

In addition, instead of p-type $In_{0.5}(Ga_{1-z}Al_z)_{0.5}P$, the second upper cladding layer 15 may be made of p-type $Al_{z1}Ga_{1-z1}As$ ($0.57 \leq z1 \leq 0.8$) having a refractive index approximately identical to the refractive index of p-type $In_{0.5}(Ga_{1-z}Al_z)_{0.5}P$.

Further, instead of p-type $Al_xGa_{1-x}As$, the first upper cladding layer 8 may be made of p-type $In_{0.5}(Ga_{1-z2}Al_{z2})_{0.5}P$ ($0.1 \leq z2 \leq 1$) having a refractive index approximately identical to the refractive index of p-type $Al_xGa_{1-x}As$.

Second Embodiment

Figure 3:
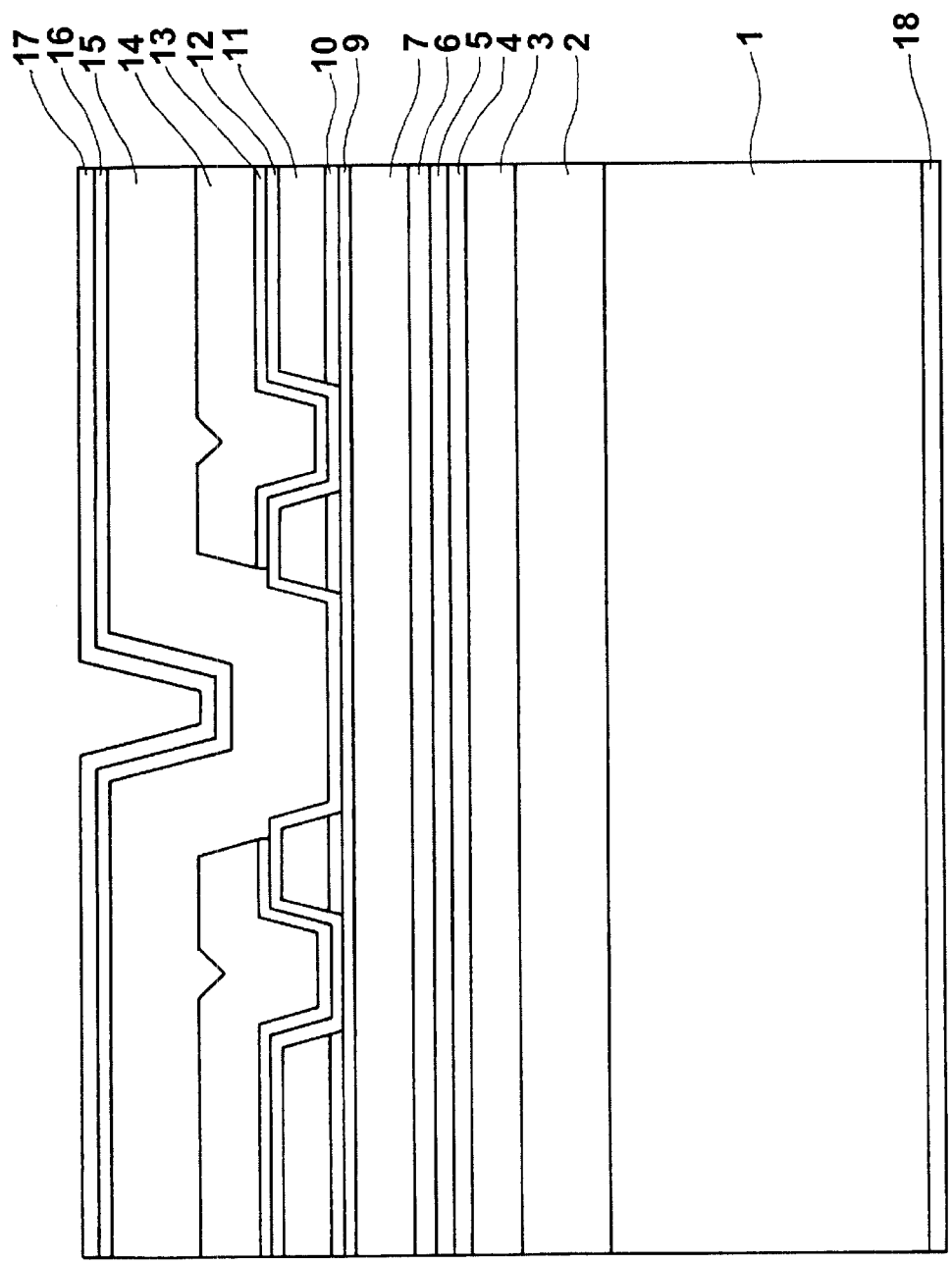
FIG. 3 is a diagram illustrating a cross section of a semiconductor laser element as a second embodiment of the present invention.

The semiconductor laser element as the second embodiment of the present invention is explained below. FIG. 3 is a diagram illustrating a cross section of the semiconductor laser element as the second embodiment of the present invention. In FIG. 3, elements having the same reference numbers as FIG. 1 have the same functions as the corresponding elements in FIG. 1, and explanations of the functions of the same elements are not repeated here. The semiconductor laser element as the second embodiment is different from the first embodiment in that the p-type $Al_xGa_{1-x}As$ first upper cladding layer 8 is not formed. The semiconductor laser element as the second embodiment can also emit a single-peak, diffraction-limited beam similarly to the first embodiment.

Third Embodiment

Figure 4:
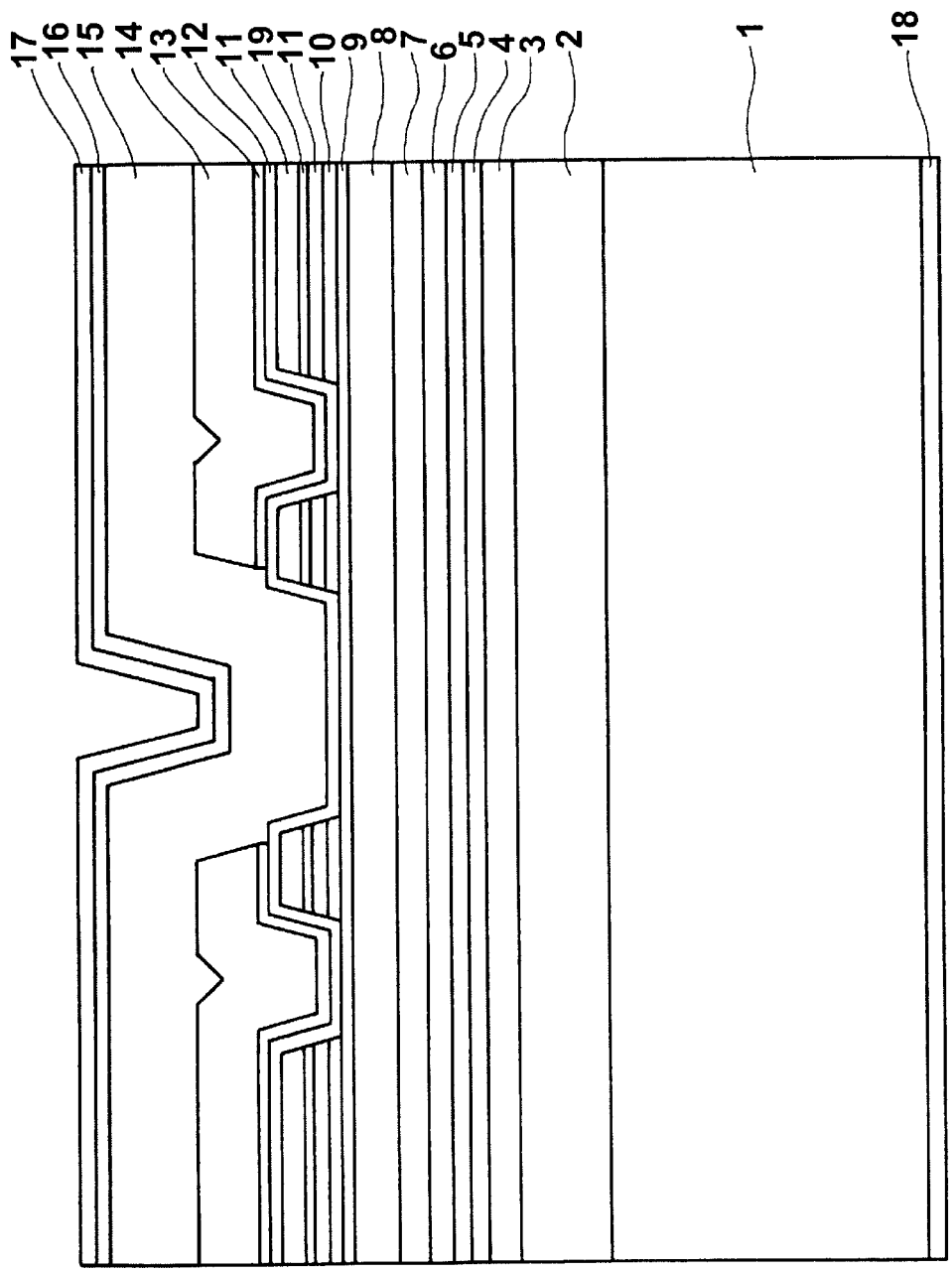
FIG. 4 is a diagram illustrating a cross section of a semiconductor laser element as a third embodiment of the present invention.

The semiconductor laser element as the third embodiment of the present invention is explained below. FIG. 4 is a diagram illustrating a cross section of the semiconductor laser element as the third embodiment of the present invention. In FIG. 4, elements having the same reference numbers as FIG. 1 have the same functions as the corresponding elements in FIG. 1, and explanations of the functions of the same elements are not repeated here. The semiconductor laser element as the third embodiment is different from the first embodiment in that the n-type GaAs first current confinement layer 11 is split into two sublayers, and a quantum-well layer 19 is formed between the two sublayers. The quantum-well layer 19 is made of an InGaAs material which has a smaller bandgap than that of the i-type $In_{x1}Ga_{1-x1}As_{1-y1}P_{y1}$ compressive-strain quantum-well active layer 5. Since the InGaAs quantum-well layer 19 absorbs light, the gain in the fundamental transverse mode is increased.

Fourth Embodiment

Figure 5:
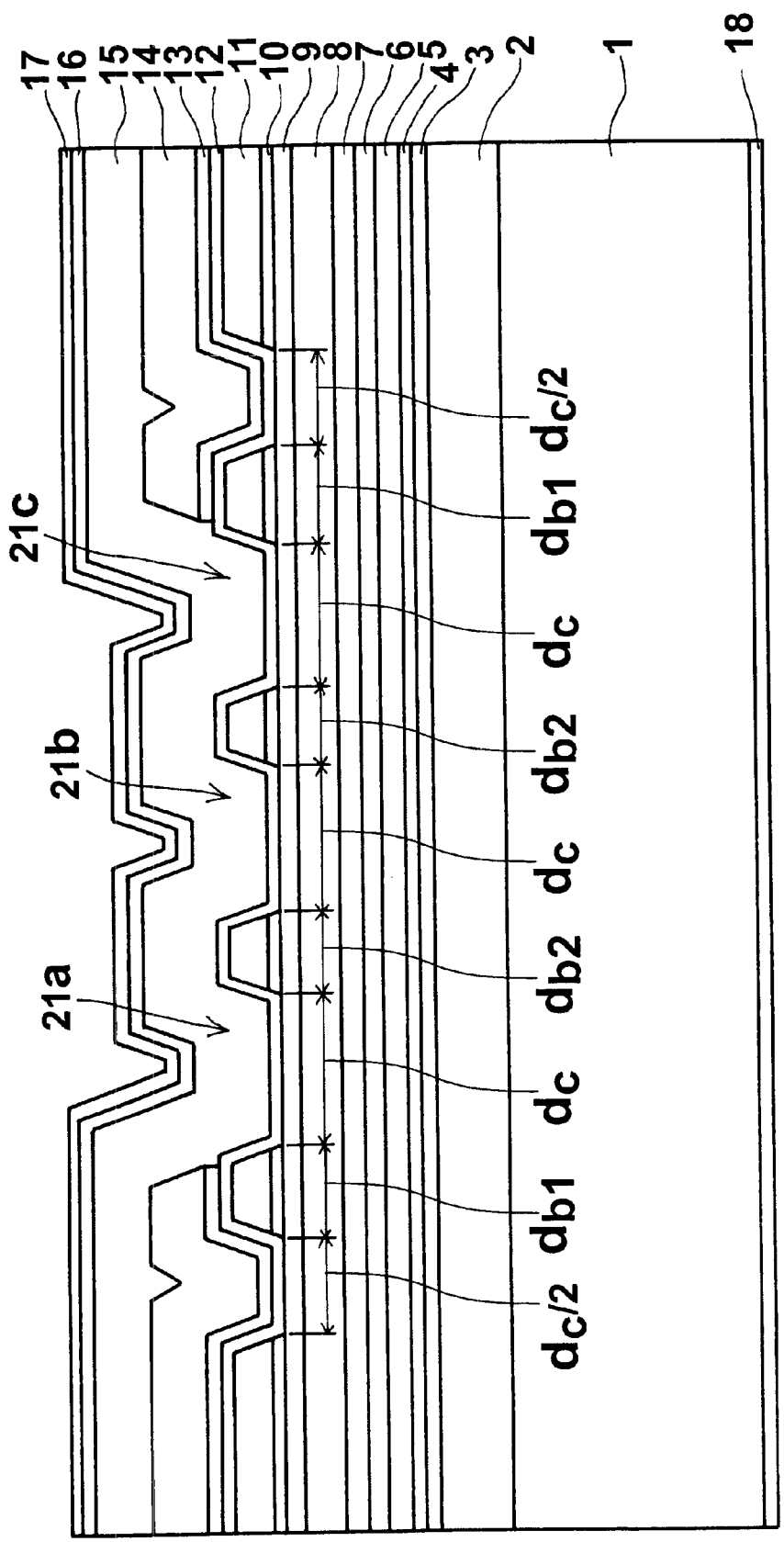
FIG. 5 is a diagram illustrating a cross section of a semiconductor laser element as a fourth embodiment of the present invention.

The semiconductor laser element as the fourth embodiment of the present invention is explained below. FIG. 5 is a diagram illustrating a cross section of the semiconductor laser element as the fourth embodiment of the present invention. In FIG. 5, elements having the same reference numbers as FIG. 1 have the same functions as the corresponding elements in FIG. 1, and explanations of the functions of the same elements are not repeated below. The semiconductor laser element as the fourth embodiment is different from the first embodiment in that the ARROW structure includes multiple (three) cores.

As illustrated in FIG. 5, the p-type $In_{x8}Ga_{1-x8}P$ second etching stop layer 10 and the n-type GaAs first current confinement layer 11 have three center openings and two side openings. The three center openings correspond to three current injection regions 21a, 21b, and 21c, are spaced with intervals $d_{b2}$, and each have a width $d_c$. Thus, the three core regions are realized. In addition, the two side openings each having a width $d_c/2$ are arranged on both sides of the three center openings, respectively separated from the outermost ones 21a and 21c of the three center openings by an interval $d_{b1}$. The output power of the semiconductor laser element can be further increased by this multicore ARROW structure.

Figure 6:
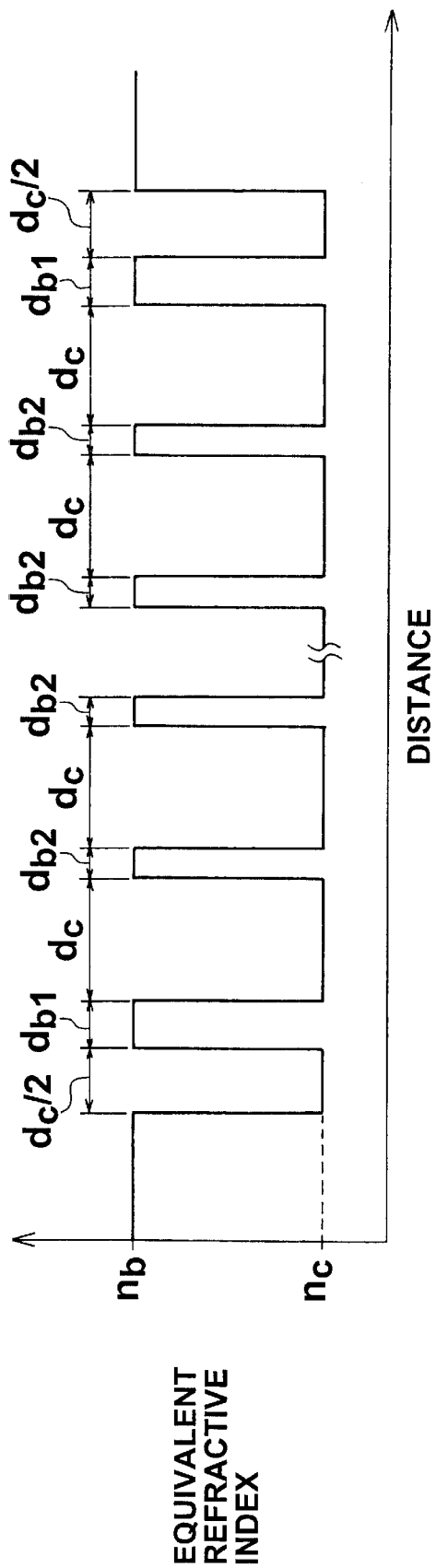
FIG. 6 is a diagram illustrating a distribution of the equivalent refractive index of an active layer in a direction perpendicular to the thickness direction and the light propagation direction in the case where the semiconductor laser element includes a multicore ARROW structure.

Generally, in a semiconductor laser element having a multicore ARROW structure, an active layer of the semiconductor laser element has a distribution of the equivalent refractive index in the direction perpendicular to the thickness direction and the light propagation direction, as illustrated in FIG. 6. Each of a plurality of core regions have a width $d_c$, and a low equivalent refractive index $n_c$. A plurality of first high-refractive-index stripe regions are arranged between the plurality of core regions and on the outer sides of the outermost ones of the plurality of core regions, and have a high equivalent refractive index $n_b$. Each of the plurality of first high-refractive-index stripe regions arranged between the plurality of core regions have a width $d_{b2}$, and each of the plurality of first high-refractive-index stripe regions arranged on the outer sides of the outermost ones of the plurality of core regions have a width $d_{b1}$. In addition, low-refractive-index regions each having a width $d_c/2$ and the low equivalent refractive index $n_c$ are arranged on the outer sides of the outermost ones of the first high-refractive-index regions, and second high-refractive-index regions having the high equivalent refractive index $n_b$ are arranged on the outer sides of the low-refractive-index regions. That is, the aforementioned ARROW structure is realized.

It is preferable that the above width $d_{b1}$ is determined by the aforementioned equation (3), and the above width $d_{b2}$ is determined by the following equation (4).

$$d_{b2} = \frac{\lambda}{2\left\{n_b^2 - n_c^2 + \left(\frac{\lambda}{2d_c}\right)^2\right\}^{\frac{1}{2}}} \quad (4)$$

Additional Matters (i) In the semiconductor laser elements of the first to fourth embodiments, in order to suppress non-radiative recombination currents due to light absorption in vicinities of resonator end facets, portions of the p-type GaAs contact layer 16 in the vicinities of resonator end facets may be removed. In this case, the output power of the semiconductor laser elements can be further increased.

(ii) In the semiconductor laser elements of the first to fourth embodiments, each of the lower barrier layer 4 and the upper barrier layer 6 may be constituted by an $In_{x4}Ga_{1-x4}As_{1-y4}P_{y4}$ ($0 \leq x4 \leq 0.49y4$, $0 \leq y4 \leq 0.5$) tensile-strain barrier layer and an $In_{x3}Ga_{1-x3}As_{1-y3}P_{y3}$ barrier layer ($0 \leq x3 \leq 0.3$, $x3=0.49y3$), where the $In_{x4}Ga_{1-x4}As_{1-y4}P_{y4}$ tensile-strain barrier layer is formed nearer to the active layer than the $In_{x3}Ga_{1-x3}As_{1-y3}P_{y3}$ barrier layer.

(iii) Each layer in the constructions of the first to fourth embodiments may be formed by molecular beam epitaxy using solid or gas raw material.

(iv) Although the constructions of the first to fourth embodiments are formed on the n-type GaAs substrates, instead, p-type GaAs substrates may be used. When the GaAs substrates are p-type, the conductivity types of all of the other layers in the constructions of the first to fourth embodiments should be inverted.

(v) Since the compressive strain quantum well active layers in the first to fourth embodiments are made of $In_{x1}Ga_{1-x1}As_{1-y1}P_{y1}$ ($0.49y1<x1 \leq 0.4$, $0 \leq y1 \leq 0.1$), the oscillation wavelengths of the semiconductor laser devices as the first to fourth embodiments can be controlled in the range of 900 to 1,200 nm.

(vi) Since the semiconductor laser elements according to the present invention is reliable even in high power operations, the semiconductor laser element according to the present invention can be used as a light source in the fields of high-speed, information processing, image processing, communications, laser measurement, medicine, printing, and the like.

What is claimed is:

1. A semiconductor laser element comprising:
    a GaAs substrate of a first conductive type;
    a lower cladding layer formed above said GaAs substrate and made of $Al_xGa_{1-x}As$ of said first conductive type, where $0.57 \leq x \leq 0.8$;
    a lower optical waveguide layer formed above said lower cladding layer and made of $In_{0.49}Ga_{0.51}P$ which is undoped or said first conductive type;
    a compressive-strain quantum-well active layer formed above said lower optical waveguide layer and made of undoped $In_{x1}Ga_{1-x1}As_{1-y1}P_{y1}$, where $0.49y1<x1 \leq 0.4$ and $0 \leq y1 \leq 0.1$;
    an upper optical waveguide layer formed above said compressive-strain quantum-well active layer and made of $In_{0.49}Ga_{0.51}P$ which is undoped or a second conductive type;
    a first etching stop layer formed above said upper optical waveguide layer and made of GaAs of said second conductive type;
    a second etching stop layer made of $In_{x8}Ga_{1-x8}P$ of said second conductive type and formed above said first etching stop layer other than stripe areas of the first etching stop layer corresponding to at least one current injection region and low-refractive-index regions located on outer sides of the at least one current injection region and separated from the at least one current injection region or outermost ones of the at least one current injection region by a predetermined interval, where $0 \leq x8 \leq 1$, and said stripe areas of the first etching stop layer extend in a direction of a laser resonator;
    a first current confinement layer made of GaAs of said first conductive type and formed above said second etching stop layer;
    a third etching stop layer made of $In_{x9}Ga_{1-x9}P$ of said second conductive type and formed over said first current confinement layer and said stripe areas of said first etching stop layer, where $0 \leq x9 \leq 1$;
    a fourth etching stop layer made of GaAs of said second conductive type and formed above said third etching stop layer other than at least one stripe area of the third etching stop layer corresponding to said at least one current injection region;
    a second current confinement layer made of $In_{0.5}(Ga_{1-z}Al_z)_{0.5}P$ of said first conductive type and formed above said fourth etching stop layer, where $0.1 \leq z \leq 1$;
    a first upper cladding layer of said second conductive type, formed above said second current confinement layer and said at least one stripe area of the third etching stop layer, and made of one of AlGaAs and $In_{0.5}(Ga_{1-z}Al_z)_{0.5}P$, where $0.1 \leq z \leq 1$; and
    a contact layer made of GaAs of said second conductive type and formed above said first upper cladding layer.

2. A semiconductor laser element according to claim 1, wherein each of said at least one current injection region has a width equal to or greater than 3 micrometers.

3. A semiconductor laser element according to claim 1, further comprising a second upper cladding layer formed between said upper optical waveguide layer and said first etching stop layer, and made of a material having identical composition and an identical conductive type to said first upper cladding layer.

4. A semiconductor laser element according to claim 1, wherein said first current confinement layer includes,
    first and second sublayers made of GaAs of said first conductive type, and
    a quantum-well layer formed between said first and second sublayers and made of an InGaAs material which has a smaller bandgap than a bandgap of the compressive-strain quantum-well active layer.

5. A semiconductor laser element according to claim 1, further comprising,
    a lower barrier layer formed between said lower optical waveguide layer and said compressive-strain quantum-well active layer, and
    an upper barrier layer formed between said upper optical waveguide layer and said compressive-strain quantum-well active layer,
    where each of said lower barrier layer and said upper barrier layer is made of undoped $In_{x2}Ga_{1-x2}As_{1-y2}P_{y2}$, where $0 \leq x2 \leq 0.3$ and $0 \leq y2 \leq 0.6$.

* * * * *